(12) United States Patent
Gao et al.

(10) Patent No.: US 8,932,733 B2
(45) Date of Patent: Jan. 13, 2015

(54) CHRYSENE DERIVATIVE HOST MATERIALS

(75) Inventors: Weiying Gao, Landenberg, PA (US);
Dean T. Deibler, Boothwyn, PA (US);
Vsevolod Rostovtsev, Swarthmore, PA (US)

(73) Assignee: E I du Pont de Nemours and Company, Wilmington, DE (US)

( * ) Notice: Subject to any disclaimer, the term of this patent is extended or adjusted under 35 U.S.C. 154(b) by 499 days.

(21) Appl. No.: 12/642,051

(22) Filed: Dec. 18, 2009

(65) Prior Publication Data

US 2010/0187981 A1 Jul. 29, 2010

Related U.S. Application Data

(60) Provisional application No. 61/138,981, filed on Dec. 19, 2008.

(51) Int. Cl.
*H01L 51/54* (2006.01)
*C09K 11/06* (2006.01)
(Continued)

(52) U.S. Cl.
CPC ............ *H05B 33/20* (2013.01); *C09K 11/06* (2013.01); *H01L 51/0054* (2013.01);
(Continued)

(58) Field of Classification Search
USPC ........................................ 428/690
See application file for complete search history.

(56) References Cited

U.S. PATENT DOCUMENTS

| 4,043,311 A | 8/1977 | Bieri |
| 5,247,190 A | 9/1993 | Friend et al. |

(Continued)

FOREIGN PATENT DOCUMENTS

| EP | 443861 A2 | 7/1995 |
| EP | 1061112 A1 | 12/2000 |

(Continued)

OTHER PUBLICATIONS

Machine English translation JP 07249490 A. Dec. 15, 2010.*
(Continued)

*Primary Examiner* — J. L. Yang

(57) ABSTRACT

There is provided an electroactive composition. The composition has (a) a host material having Formula I

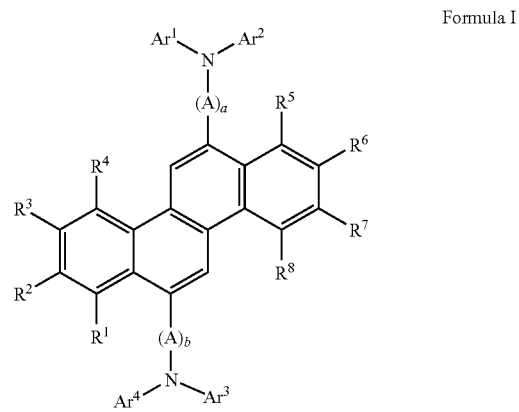

Formula I and (b) an electroactive dopant capable of electroluminescence having an emission maximum between 500 and 700 nm. In Formula I:
$R^1$ to $R^8$ are the same or different and can be H, alkyl, or alkoxy, or adjacent R groups may be joined together to form a 5- or 6-membered aliphatic ring, with the proviso that at least one of $R^1$ to $R^8$ is not H,
$Ar^1$ to $Ar^4$ are the same or different and are aryl groups,
A is the same or different at each occurrence and can be a single bond or a phenylene group, and
a and b are the same or different and are an integer of 0-2.

10 Claims, 1 Drawing Sheet

(51) Int. Cl.
| | |
|---|---|
| H05B 33/20 | (2006.01) |
| H01L 51/00 | (2006.01) |
| H05B 33/14 | (2006.01) |
| C09B 6/00 | (2006.01) |
| C09B 57/00 | (2006.01) |
| C09B 1/00 | (2006.01) |
| C09B 3/14 | (2006.01) |
| H01L 51/50 | (2006.01) |

(52) U.S. Cl.
CPC ............ H01L 51/006 (2013.01); H05B 33/14 (2013.01); C09B 6/00 (2013.01); C09B 57/00 (2013.01); C09B 1/00 (2013.01); C09B 3/14 (2013.01); C09K 2211/1007 (2013.01); C09K 2211/1011 (2013.01); C09K 2211/1014 (2013.01); H01L 51/5016 (2013.01); Y10S 428/917 (2013.01)
USPC ........ 428/690; 428/917; 428/411.1; 428/336; 252/301.16

(56) References Cited

U.S. PATENT DOCUMENTS

| | | | |
|---|---|---|---|
| 5,408,109 A | 4/1995 | Heeger | |
| 6,670,645 B2 | 12/2003 | Grushin et al. | |
| 6,852,429 B1 | 2/2005 | Li et al. | |
| 6,875,524 B2 | 4/2005 | Hatwar et al. | |
| 7,075,102 B2* | 7/2006 | Grushin et al. | 257/40 |
| 7,173,131 B2 | 2/2007 | Saitoh et al. | |
| 7,358,409 B2 | 4/2008 | Saitoh et al. | |
| 7,375,250 B2 | 5/2008 | Saitoh et al. | |
| 7,491,450 B2 | 2/2009 | Okinaka et al. | |
| 7,651,788 B2 | 1/2010 | Seo et al. | |
| 7,709,104 B2 | 5/2010 | Saitoh et al. | |
| 2002/0076576 A1 | 6/2002 | Li | |
| 2003/0072966 A1 | 4/2003 | Hosokawa et al. | |
| 2004/0102577 A1 | 5/2004 | Hsu et al. | |
| 2004/0106003 A1 | 6/2004 | Chen et al. | |
| 2004/0121184 A1 | 6/2004 | Thompson et al. | |
| 2004/0127637 A1 | 7/2004 | Hsu et al. | |
| 2005/0031898 A1 | 2/2005 | Li et al. | |
| 2005/0064233 A1 | 3/2005 | Matsuura et al. | |
| 2005/0158577 A1 | 7/2005 | Ishibashi et al. | |
| 2005/0184287 A1 | 8/2005 | Mears et al. | |
| 2005/0204860 A1 | 9/2005 | Winefordner et al. | |
| 2006/0033421 A1 | 2/2006 | Matsuura et al. | |
| 2006/0052641 A1* | 3/2006 | Funahashi | 564/426 |
| 2006/0113528 A1 | 6/2006 | Okinaka et al. | |
| 2006/0115678 A1 | 6/2006 | Saitoh et al. | |
| 2006/0121312 A1 | 6/2006 | Yamada et al. | |
| 2006/0152146 A1* | 7/2006 | Funahashi | 313/504 |
| 2006/0159838 A1 | 7/2006 | Kowalski et al. | |
| 2006/0194074 A1 | 8/2006 | Funahashi | |
| 2006/0210830 A1 | 9/2006 | Funahashi | |
| 2006/0267488 A1 | 11/2006 | Saitoh et al. | |
| 2007/0063638 A1 | 3/2007 | Tokairin et al. | |
| 2007/0114917 A1 | 5/2007 | Funahashi | |
| 2007/0236137 A1 | 10/2007 | Funahashi | |
| 2007/0255076 A1 | 11/2007 | Ito et al. | |
| 2007/0292713 A9 | 12/2007 | Dobbs et al. | |
| 2007/0298530 A1 | 12/2007 | Feehery | |
| 2008/0049413 A1* | 2/2008 | Jinde et al. | 362/84 |
| 2008/0071049 A1 | 3/2008 | Radu et al. | |
| 2008/0191614 A1 | 8/2008 | Kim et al. | |
| 2008/0193796 A1* | 8/2008 | Arakane et al. | 428/690 |
| 2008/0233433 A1 | 9/2008 | Igarashi et al. | |
| 2008/0286605 A1 | 11/2008 | Takeda | |
| 2008/0303425 A1 | 12/2008 | Rostovtsev et al. | |
| 2009/0058279 A1 | 3/2009 | Takeda | |
| 2009/0085479 A1* | 4/2009 | Ushikubo | 313/506 |

FOREIGN PATENT DOCUMENTS

| | | | | |
|---|---|---|---|---|
| EP | 1561794 A1 | 8/2005 | | |
| EP | 2067766 A1 | 6/2009 | | |
| EP | 2067767 A1 | 6/2009 | | |
| JP | 07249490 A | * 9/1995 | ............ | H05B 33/14 |
| JP | 2004010550 A | 1/2004 | | |
| JP | 2006052323 A | 2/2006 | | |
| JP | 2006151844 A | 6/2006 | | |
| JP | 2006219392 A | 8/2006 | | |
| JP | 2007186449 A | 7/2007 | | |
| JP | 2009161470 A | 7/2009 | | |
| KR | 1020090046731 A | 5/2009 | | |
| KR | 1020090086015 A | 8/2009 | | |
| KR | 1020090086920 A | 8/2009 | | |
| KR | 1020090093897 A | 9/2009 | | |
| WO | 03/040257 A1 | 5/2003 | | |
| WO | 2005/052027 A1 | 5/2003 | | |
| WO | 03040257 A1 | 5/2003 | | |
| WO | 03/063555 A1 | 7/2003 | | |
| WO | 03063555 A1 | 7/2003 | | |
| WO | 2004/016710 A1 | 2/2004 | | |
| WO | 2004016710 A1 | 2/2004 | | |
| WO | 2005052027 A1 | 6/2005 | | |
| WO | 2006025273 A1 | 3/2006 | | |
| WO | 2007021117 A1 | 2/2007 | | |
| WO | 2007100096 A1 | 9/2007 | | |
| WO | 2007105917 A1 | 9/2007 | | |
| WO | 2007108666 A1 | 9/2007 | | |
| WO | 2008149968 A1 | 12/2008 | | |
| WO | 2009018009 A1 | 2/2009 | | |
| WO | 2009028902 A2 | 3/2009 | | |
| WO | 2009055628 A1 | 4/2009 | | |

OTHER PUBLICATIONS

CRC Handbook of Chemistry and Physics, 81$^{st}$ Edition (2000-2001).
Markus, John, Electronics and Nuleonics Dictionary, 470 and 476 (McGraw-Hill 1966).
"Flexible Light-Emitting Diodes Made from Soluble Conducting Polymer," Nature, vol. 357, pp. 477-479 (Jun. 11, 1992).
Kirk-Othmer Encyclopedia of Chemical Technology, Fourth Edition, vol. 18, p. 837-860, by Y. Wang.
Beckmann et al., Methyl Reorientation in Solid 3-ethychrysene and 3-isopropylesene; Solid State Nuclear Magnetic Resonance, 1998; vol. 12; pp. 251-256.
Kodomari et al., Selective Halogenation of Aromatic Hydrocarbons; J. Org. Chem.,1988, vol. 53 p. 2093.
Mueller et al, Synthesis and Characterization of Soluble Oligo(9,10-anthrylene)s, Chem. Ber. 1994, 127, pp. 437-444.
Negishi et al; III.2.15 Palladium Catalyzed Conjugate Substitution; Handbook of Organopalladium Chemistry for Organic Synthesis, 2000 vol. 1 pp. 767-789.
International Search Report Korean Intellectual Property Office, Daejeon, Republic of Korea, Hyun Shik Oh, Authorized Offier, Dec. 24, 2010, in PCT/US10/035364.
International Search Report, European Patent Office, Rijswijk NL, in PCT/2008/063811, PCT copending U.S. Appl. No. 12/121,883, Csaba A. Nemes, Authorized Officer, Jul. 29, 2008.
International Search Report, European Patent Office, Rijswijk NL, in PCT/2008/065091, PCT copending U.S. Appl. No. 12/129,760, Alina Sen, Authorized Officer, Oct. 23, 2008.
International Search Report, European Patent Office, Rijswijk NL, in PCT/2008/065187, PCT copending U.S. Appl. No. 12/129,753, Cecile Vanier, Authorized Officer, Feb. 10, 2008.
International Search Report, Korean Intellectual Property Office, Daejeon, Republic of Korea, in PCT/2009/065163, PCT copending U.S. Appl. No. 13/120,001, Hyun Shik Oh, Authorized Officer, May 19, 2010.
International Search Report, Korean Intellectual Property Office, Daejeon, Republic of Korea, in PCT/2009/068928, PCT copending U.S. Appl. No. 12/643,511, Hyun Shik Oh, Authorized Officer, Aug. 17, 2010.

(56) References Cited

OTHER PUBLICATIONS

International Search Report, Korean Intellectual Property Office, Daejeon, Republic of Korea, in PCT/2009/068956, PCT copending U.S. Appl. No. 12/643,487, Hyun Shik Oh, Authorized Officer, Sep. 6, 2010.

International Search Report, Korean Intellectual Property Office, Daejeon, Republic of Korea, in PCT/2010/040578, PCT copending application, Hyun Shik Oh, Authorized Officer, Feb. 11, 2011.

* cited by examiner

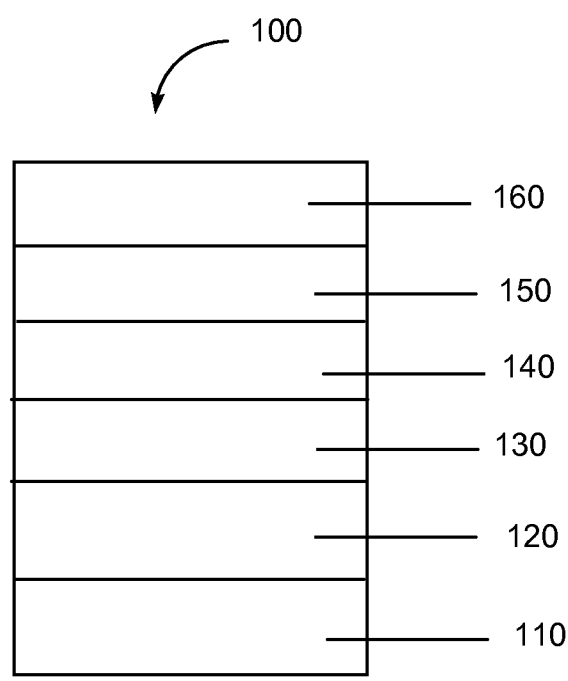

CHRYSENE DERIVATIVE HOST MATERIALS

RELATED APPLICATION

This application claims priority under 35 U.S.C. §119(e) from Provisional Application No. 61/138,981 filed on Dec. 19, 2008 which is incorporated by reference herein in its entirety.

BACKGROUND INFORMATION

1. Field of the Disclosure

This disclosure relates in general to chrysene derivative host materials and their use in organic electronic devices.

2. Description of the Related Art

Organic electronic devices are present in many different kinds of electronic equipment. In all such devices, an organic electroactive layer is sandwiched between two electrical contact layers. One example of such devices is an organic light-emitting diode ("OLED"), in which a light-emitting layer is present between the electrical contact layers. At least one of the electrical contact layers is light-transmitting so that light can pass through the electrical contact layer. The organic active layer emits light through the light-transmitting electrical contact layer upon application of electricity across the electrical contact layers. Additional electroactive layers may be present between the light-emitting layer and the electrical contact layer(s).

It is well known to use organic electroluminescent compounds as the active component in light-emitting diodes. Simple organic molecules, such as anthracene, thiadiazole derivatives, and coumarin derivatives are known to show electroluminescence. In some cases these small molecule materials are present as a dopant in a host material to improve processing and/or electronic properties.

There is a continuing need for new host materials for electronic devices.

SUMMARY

There is provided an electroactive composition comprising (a) a host material having Formula I

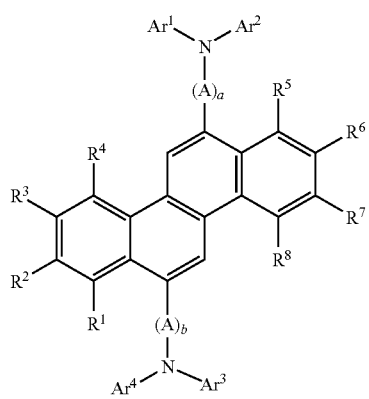

Formula I where:
R$^1$ to R$^8$ are the same or different and are selected from the group consisting of H, alkyl, and alkoxy, or adjacent R groups may be joined together to form a 5- or 6-membered aliphatic ring, with the proviso that at least one of R$^1$ to R$^8$ is not H, Ar$^1$ to Ar$^4$ are the same or different and are aryl groups,
A is the same or different at each occurrence and is selected from the group consisting of a single bond and a phenylene group, and
a and b are the same or different and are an integer of 0-2; and (b) an electroactive dopant capable of electroluminescence having an emission maximum between 500 and 700 nm.

In another embodiment, there is provided an organic electronic device comprising two electrical contact layers with an organic electroactive layer therebetween, wherein the electroactive layer comprises the electroactive composition described above.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

FIG. 1 includes an illustration of one example of an organic electronic device.

Skilled artisans appreciate that objects in the figures are illustrated for simplicity and clarity and have not necessarily been drawn to scale.

For example, the dimensions of some of the objects in the figures may be exaggerated relative to other objects to help to improve understanding of embodiments.

DETAILED DESCRIPTION

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms, followed by the Chrysene Derivative Host Materials, the Dopant Materials, the Organic Electronic Device, and finally Examples.

1. Definitions and Clarification of Terms

Before addressing details of embodiments described below, some terms are defined or clarified.

As used herein, the term "compound" is intended to mean an electrically uncharged substance made up of molecules that further consist of atoms, wherein the atoms cannot be separated by physical means. The phrase "adjacent to," when used to refer to layers in a device, does not necessarily mean that one layer is immediately next to another layer. On the other hand, the phrase "adjacent R groups," is used to refer to R groups that are next to each other in a chemical formula (i.e., R groups that are on atoms joined by a bond). The term "photoactive" refers to any material that exhibits electroluminescence and/or photosensitivity.

The term "aryl" is intended to mean a group derived from an aromatic hydrocarbon having one point of attachment. The term includes groups which have a single ring and those which have multiple rings which can be joined by a single bond or fused together. The term is intended to include heteroaryls. The term "arylene" is intended to mean a group derived from an aromatic hydrocarbon having two points of attachment. In some embodiments, an aryl group has from 3-60 carbon atoms.

The term "alkyl" is intended to mean a group derived from an aliphatic hydrocarbon having one point of attachment, and includes a linear, a branched, or a cyclic group. The term is intended to include heteroalkyls. The term "alkylene" is intended to mean a group derived from an aliphatic hydrocarbon and having two or more points of attachment. In some embodiments, an alkyl group has from 1-20 carbon atoms.

The term "branched alkyl" refers to an alkyl group having at least one secondary or tertiary carbon. The term "secondary alkyl" refers to a branched alkyl group having a secondary carbon atom. The term "tertiary alkyl" refers to a branched alkyl group having a tertiary carbon atom. In some embodiments, the branched alkyl group is attached via a secondary or tertiary carbon.

The term "aliphatic ring" is intended to mean a cyclic group that does not have delocalized pi electrons. In some embodiments, the aliphatic ring has no unsaturation. In some embodiments, the ring has one double or triple bond.

The term "dopant" is intended to mean a material, within a layer including a host material, that changes the electronic characteristic(s) or the targeted wavelength(s) of radiation emission, reception, or filtering of the layer compared to the electronic characteristic(s) or the wavelength(s) of radiation emission, reception, or filtering of the layer in the absence of such material.

The term "electroactive" as it refers to a layer or a material, is intended to indicate a layer or material which electronically facilitates the operation of the device. Examples of active materials include, but are not limited to, materials which conduct, inject, transport, or block a charge, where the charge can be either an electron or a hole, or materials which emit radiation or exhibit a change in concentration of electron-hole pairs when receiving radiation. Examples of inactive materials include, but are not limited to, planarization materials, insulating materials, and environmental barrier materials.

The term "emission maximum" is intended to mean the highest intensity of radiation emitted. The emission maximum has a corresponding wavelength.

The term "green light-emitting material" is intended to mean a material capable of emitting radiation that has an emission maximum at a wavelength in a range of approximately 500-600 nm.

The term "host material" is intended to mean a material, usually in the form of a layer, to which a dopant may or may not be added. The host material may or may not have electronic characteristic(s) or the ability to emit, receive, or filter radiation.

The term "layer" is used interchangeably with the term "film" and refers to a coating covering a desired area. The term is not limited by size. The area can be as large as an entire device or as small as a specific functional area such as the actual visual display, or as small as a single sub-pixel. Layers and films can be formed by any conventional deposition technique, including vapor deposition, liquid deposition (continuous and discontinuous techniques), and thermal transfer. Continuous deposition techniques, include but are not limited to, spin coating, gravure coating, curtain coating, dip coating, slot-die coating, spray coating, and continuous nozzle coating. Discontinuous deposition techniques include, but are not limited to, ink jet printing, gravure printing, and screen printing.

The term "organic electronic device," or sometimes just "electronic device," is intended to mean a device including one or more organic semiconductor layers or materials.

The term "photoactive" is intended to mean a material or layer that emits light when activated by an applied voltage (such as in a light emitting diode or chemical cell) or responds to radiant energy and generates a signal with or without an applied bias voltage (such as in a photodetector).

The term "red light-emitting material" is intended to mean a material capable of emitting radiation that has an emission maximum at a wavelength in a range of approximately 600-700 nm.

The prefix "fluoro" indicates that one or more available hydrogen atoms have been replaced with a fluorine atom.

The prefix "hetero" indicates that one or more carbon atoms have been replaced with a different atom. In some embodiments, the different atom is N, O, or S.

All groups may be unsubstituted or substituted. In some embodiments, the substituents are selected from the group consisting of halide, alkyl, alkoxy, aryl, aryloxy, and fluoroalkyl.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics,* 81$^{st}$ Edition (2000-2001).

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. Chrysene Derivative Host Materials

Aluminum quinoline complexes, such as bis(2-methyl-8-quinolinato) -4-phenylphenolate aluminum (BAlq) are frequently used as host materials, particularly for phosphorescent metal complex emitters. However, BAlq compounds are air and moisture sensitive. Potential substitutes such as Gaquinoline complexes have better air and moisture stability, but gives lower device performance. There is therefore a need for better hosts.

The present inventors have discovered that a class of chrysene derivative materials have increased triplet energy and therefore are suitable as host materials for both phosphorescent and fluorescent red and green light-emitting materials. The chrysene derivative materials are air stable and moisture insensitive. Solutions that are exposed to air for overnight are found to give same performance in efficiency and lifetime as solutions that have never seen air.

The chrysene derivative materials which are suitable as host materials have Formula I

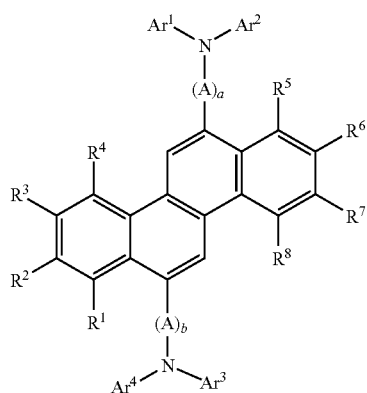

Formula I where:
R$^1$ to R$^8$ are the same or different and are selected from the group consisting of H, alkyl, and alkoxy, or adjacent R groups may be joined together to form a 5- or 6-membered aliphatic ring, with the proviso that at least one of R$^1$ to R$^8$ is not H, Ar$^1$ to Ar$^4$ are the same or different and are aryl groups, A is the same or different at each occurrence and is selected from the group consisting of a single bond and a phenylene group, and a and b are the same or different and are an integer of 0-2.

In some embodiments, R2 and R6 are alkyl and all other R groups are H.

In some embodiments, R3 is alkyl and all other R groups are H.

In some embodiments, there is at least one branched alkyl group. In some embodiments, at least one of R2, R3, R6 and R7 is a branched alkyl group. In some embodiments, the branched alkyl group is 2-propyl group or a t-butyl group.

In some embodiments, A$^1$ through Ar4 are selected from the group consisting of phenyl, biphenyl, naphthyl, phenanthryl, 4-naphthylphenyl, and 4-phenanthrylphenyl, where any of the preceding groups may be further substituted with one or more alkyl groups. As used herein, the terms biphenyl, naphthyl, phenanthryl, 4-naphthylphenyl, and 4-phenanthrylphenyl refer to the following substituent groups, where the dashed lines indicate the possible points of attachment to the nitrogen:

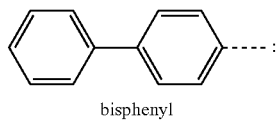

bisphenyl

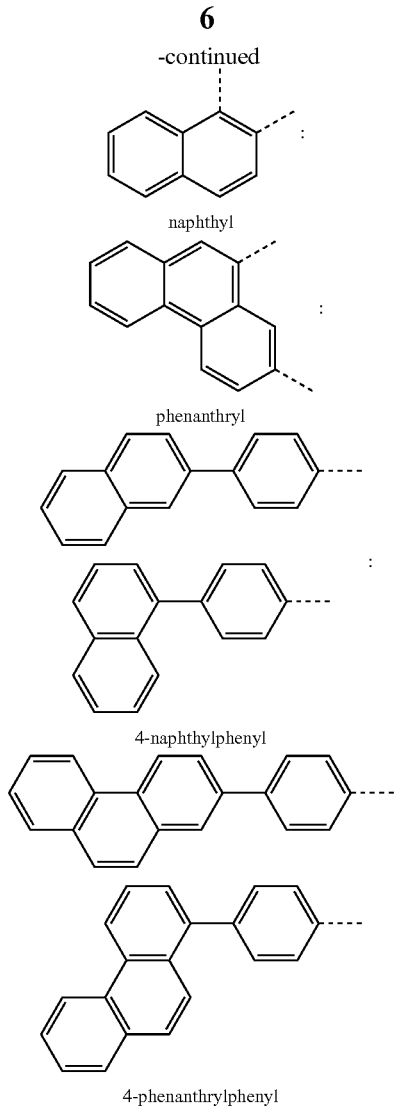

naphthyl phenanthryl 4-naphthylphenyl 4-phenanthrylphenyl

In some embodiments, Ar1=Ar3. In some embodiments, Ar1=Ar3 and Ar2=Ar4.

In some embodiments, both A groups are the same.

In some embodiments, the chrysene host compound is selected from compounds C1 through C21 below.

C1:

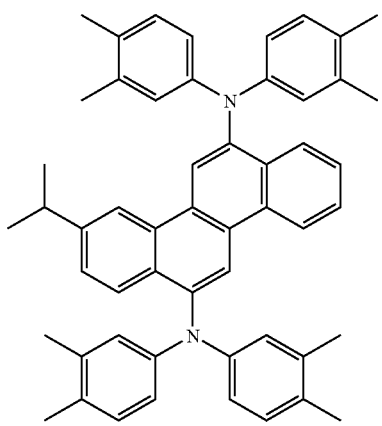

C2:
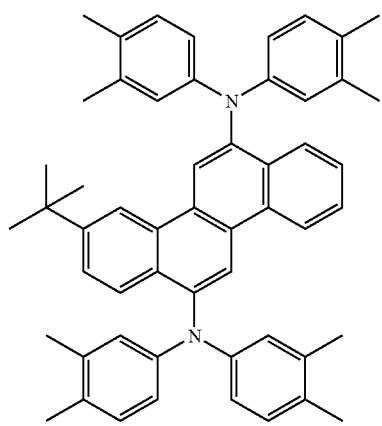
C3:
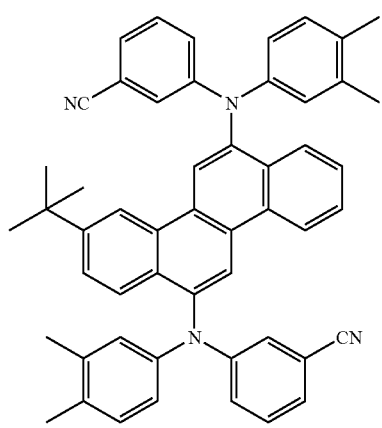
C4:
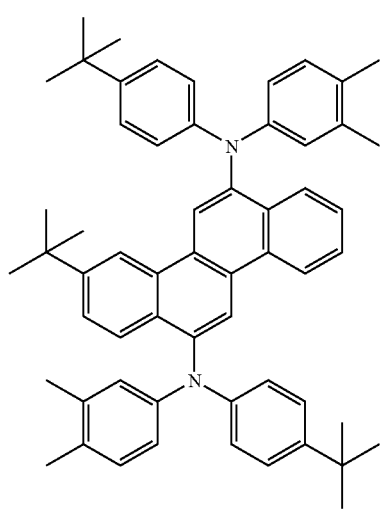
C5:
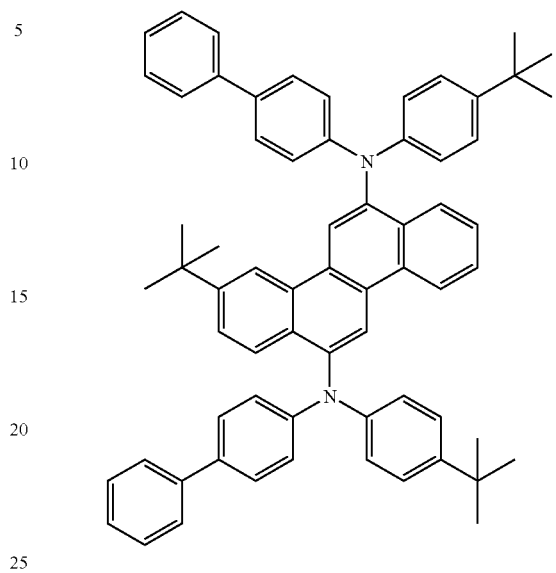
C6:
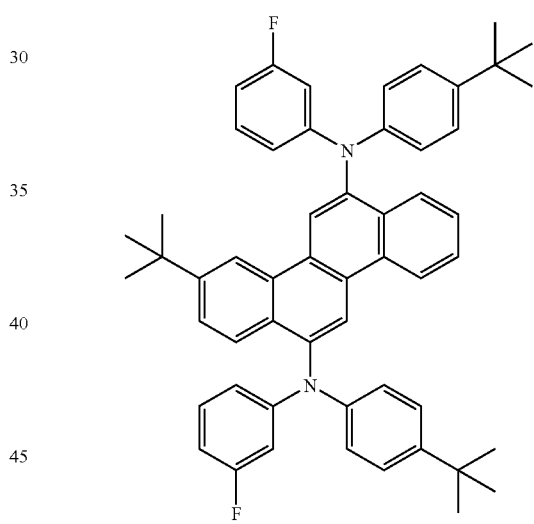
C7:
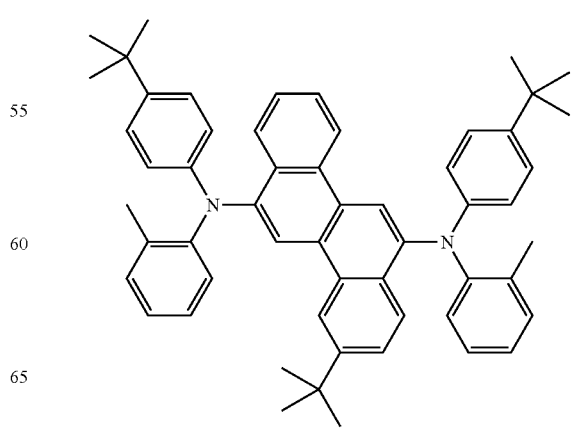

C8:
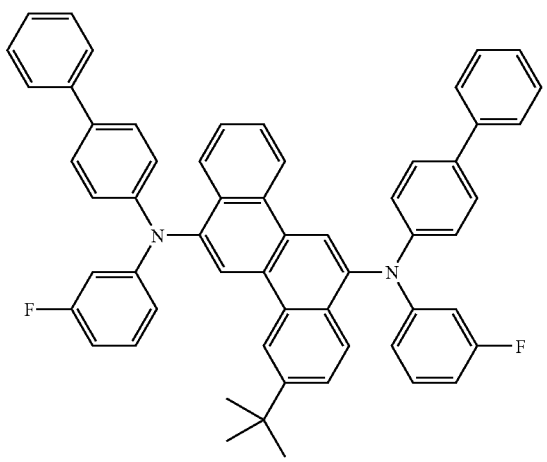
C9:
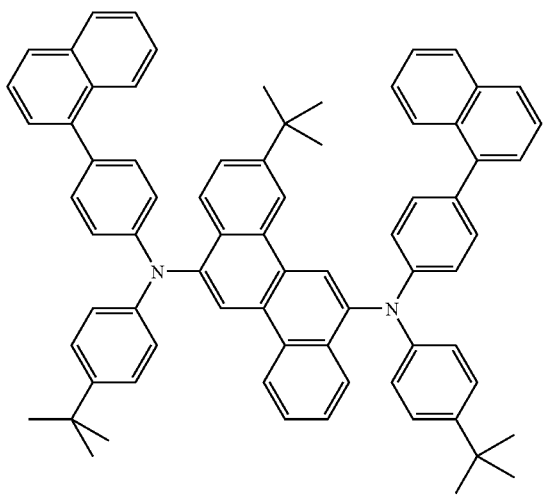
C10:
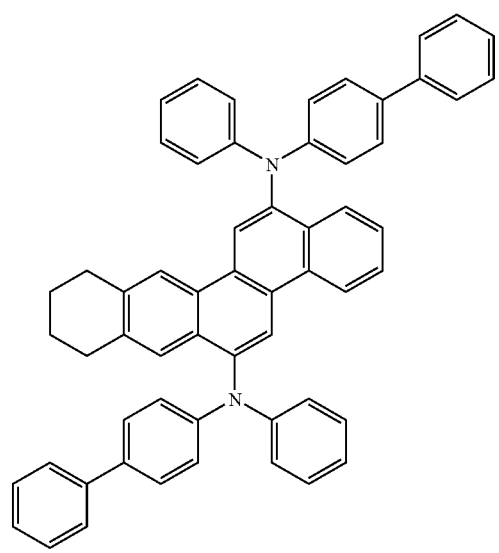
C11:
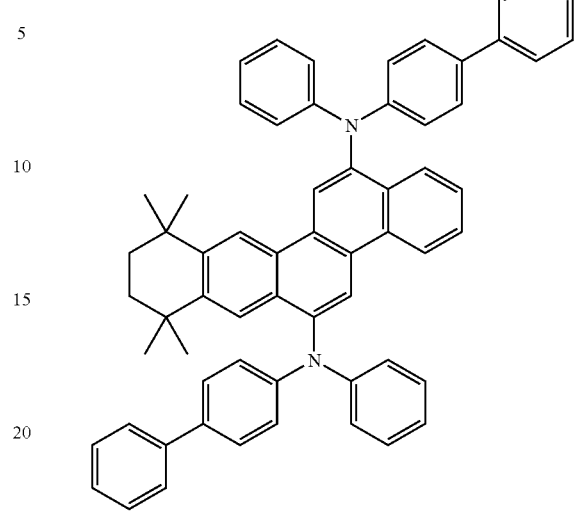
C12:
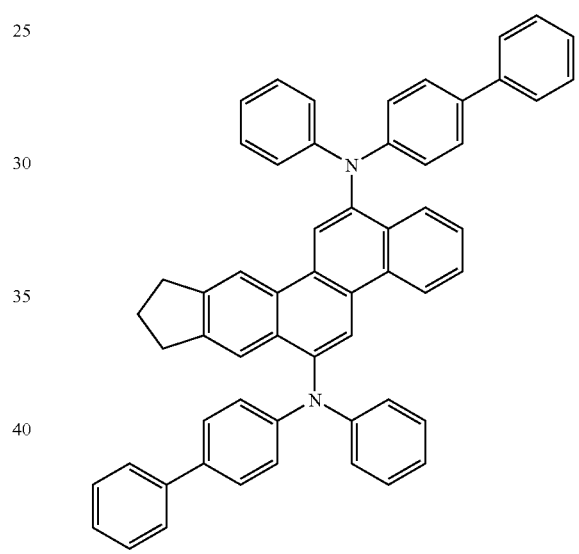
C13:
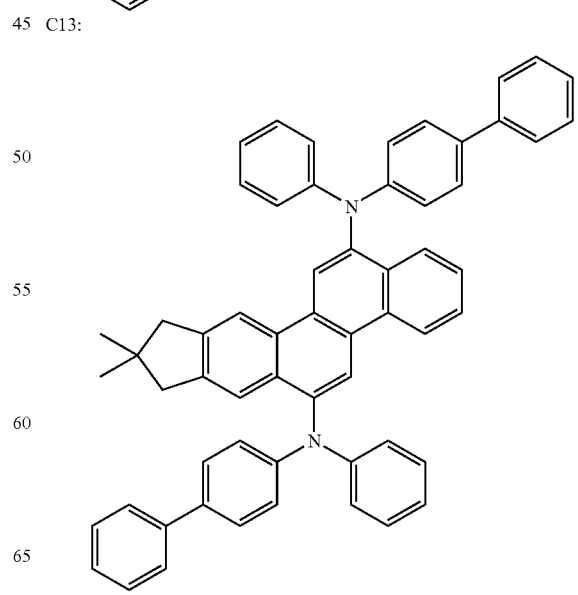

C14:
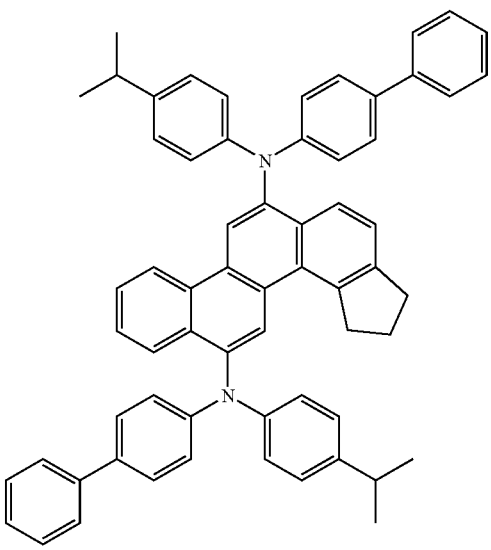
C15:
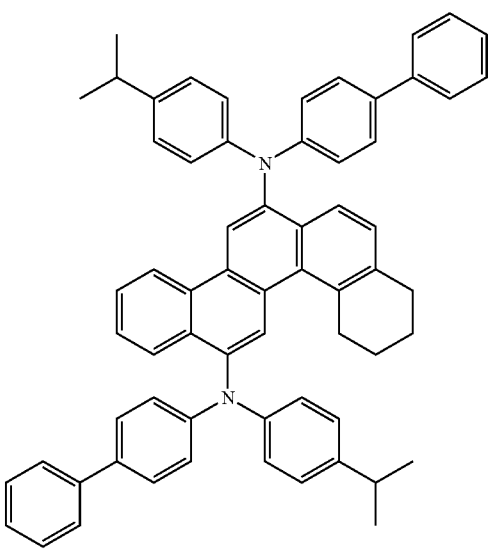
C16:
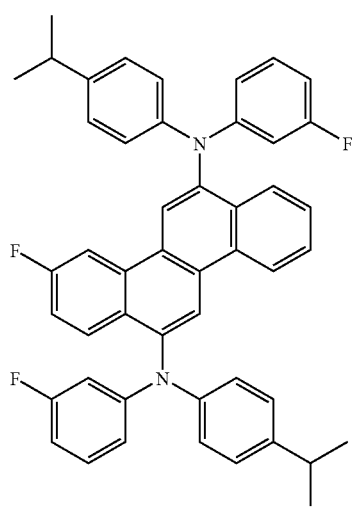
C17:
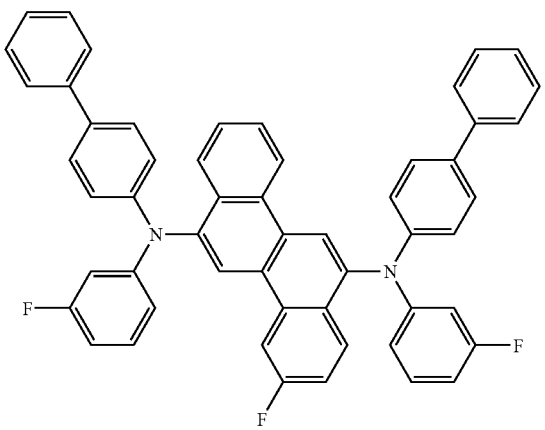
C18:
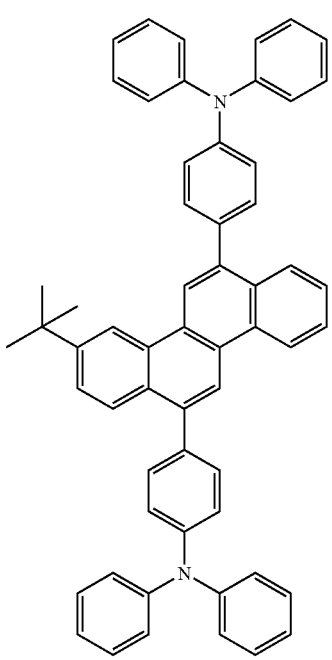

C19:

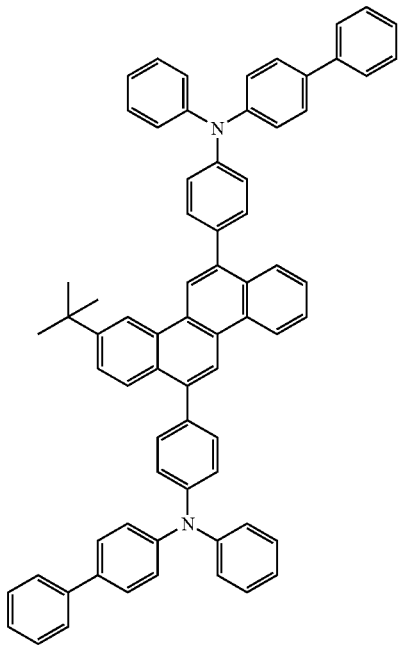

C20:

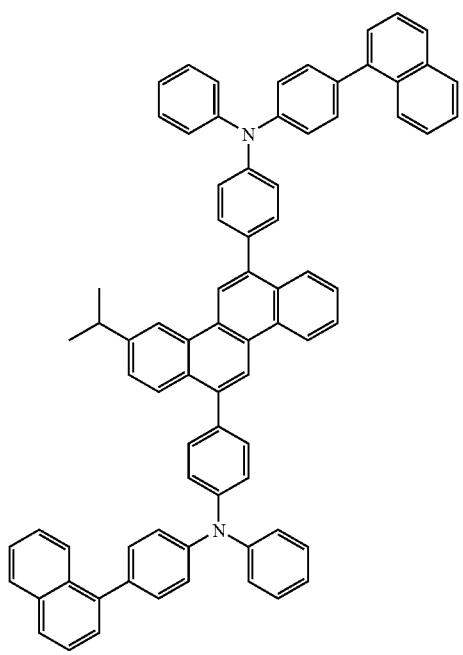

C21:

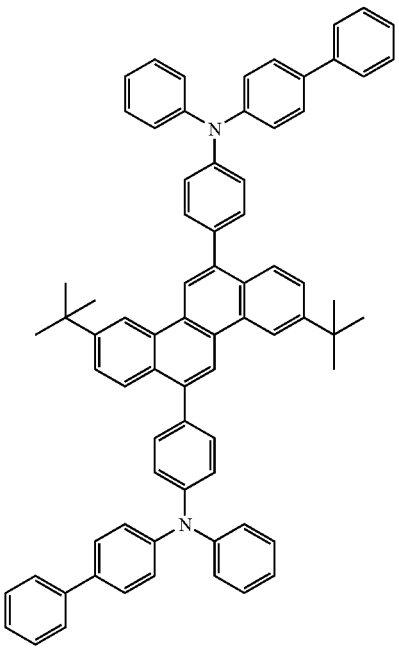

The chrysene derivative host materials can be prepared by known coupling and substitution reactions. Exemplary preparations are given in the Examples.

3. Dopant Materials

The dopant is an electroactive material which is capable of electroluminescence having an emission maximum between 500 and 700 nm. In some embodiments, the dopant emits red or green light.

In some embodiments, the dopant is an organometallic complex. In some embodiments, the dopant is a cyclometalated complex of iridium or platinum. Such materials have been disclosed in, for example, U.S. Pat. No. 6,670,645 and Published PCT Applications WO 03/063555, WO 2004/016710, and WO 03/040257.

In some embodiments, the dopant is a complex having the formula $Ir(L1)_a(L2)_b(L3)_c$; where L1 is a monoanionic bidentate cyclometalating ligand coordinated through carbon and nitrogen;

L2 is a monoanionic bidentate ligand which is not coordinated through a carbon;

L3 is a monodentate ligand;

a is 1-3;

b and c are independently 0-2;

and a, b, and c are selected such that the iridium is hexa-coordinate and the complex is electrically neutral.

Some examples of formulae include, but are not limited to, $Ir(L1)_3$; $Ir(L1)_2(L2)$; and $Ir(L1)_2(L3)(L3')$, where L3 is anionic and L3' is nonionic.

Examples of L1 ligands include, but are not limited to phenylpyridines, phenylquinolines, phenylpyrimidines, phenylpyrazoles, thienylpyridines, thienylquinolines, and thienylpyrimidines. As used herein, the term "quinolines" includes "isoquinolines" unless otherwise specified. The fluorinated derivatives can have one or more fluorine substituents. In some embodiments, there are 1-3 fluorine substituents on the non-nitrogen ring of the ligand.

Monoanionic bidentate ligands, L2, are well known in the art of metal coordination chemistry. In general these ligands have N, O, P, or S as coordinating atoms and form 5- or 6-membered rings when coordinated to the iridium. Suitable coordinating groups include amino, imino, amido, alkoxide, carboxylate, phosphino, thiolate, and the like. Examples of suitable parent compounds for these ligands include β-dicarbonyls (β-enolate ligands), and their N and S analogs; amino carboxylic acids (aminocarboxylate ligands); pyridine carboxylic acids (iminocarboxylate ligands); salicylic acid derivatives (salicylate ligands); hydroxyquinolines (hydroxyquinolinate ligands) and their S analogs; and phosphinoalkanols (phosphinoalkoxide ligands).

Monodentate ligand L3 can be anionic or nonionic. Anionic ligands include, but are not limited to, H⁻ ("hydride") and ligands having C, O or S as coordinating atoms. Coordinating groups include, but are not limited to alkoxide, carboxylate, thiocarboxylate, dithiocarboxylate, sulfonate, thiolate, carbamate, dithiocarbamate, thiocarbazone anions, sulfonamide anions, and the like. In some cases, ligands listed above as L2, such as β-enolates and phosphinoakoxides, can act as monodentate ligands. The monodentate ligand can also be a coordinating anion such as halide, cyanide, isocyanide, nitrate, sulfate, hexahaloantimonate, and the like. These ligands are generally available commercially.

The monodentate L3 ligand can also be a non-ionic ligand, such as CO or a monodentate phosphine ligand.

In some embodiments, one or more of the ligands has at least one substituent selected from the group consisting of F and fluorinated alkyls.

The iridium complex dopants can be made using standard synthetic techniques as described in, for example, U.S. Pat. No. 6,670,645.

In some embodiments, the dopant is a red light-emitting material and is a complex selected from compounds D1 through D7 below.

D1:

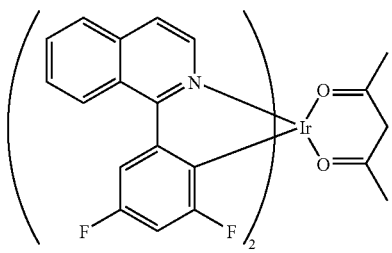

D2:

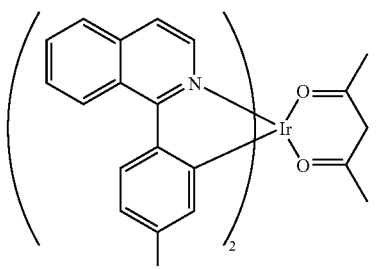

D3:

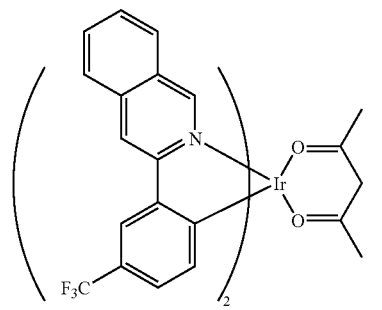

D4:

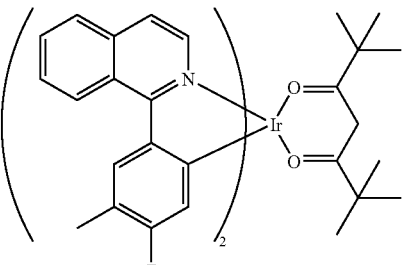

D5:

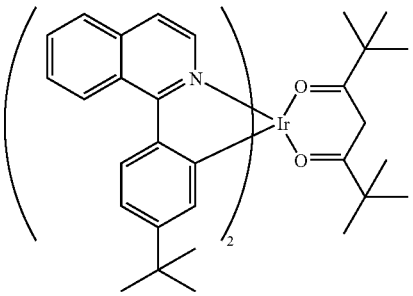

D6:

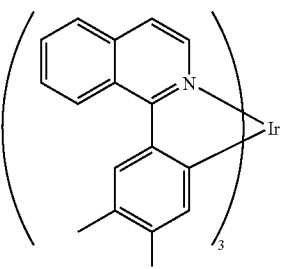

D7:

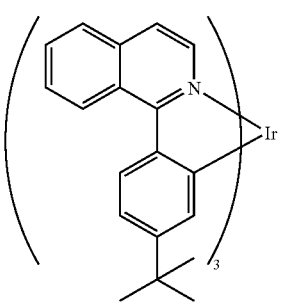

In some embodiments, the dopant is a green light-emitting material and is a complex selected from D8 and D9 below.

D8:

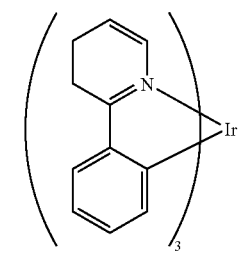

-continued

D9:

[Chemical structure showing an iridium complex with F₂HCF₂CO group, subscript 3]

In some embodiments, the dopant is an organic compound. In some embodiments, the dopant is selected from the group consisting of a non-polymeric spirobifluorene compound and a fluoranthene compound.

In some embodiments, the dopant is a compound having aryl amine groups. In some embodiments, the photoactive dopant is selected from the formulae below:

[Chemical structures of aryl amine dopants]

where:
A is the same or different at each occurrence and is an aromatic group having from 3-60 carbon atoms;
Q is a single bond or an aromatic group having from 3-60 carbon atoms;
n and m are independently an integer from 1-6.

In some embodiments of the above formula, at least one of A and Q in each formula has at least three condensed rings. In some embodiments, m and n are equal to 1.

In some embodiments, Q is a styryl or styrylphenyl group.

In some embodiments, Q is an aromatic group having at least two condensed rings. In some embodiments, Q is selected from the group consisting of naphthalene, anthracene, chrysene, pyrene, tetracene, xanthene, perylene, coumarin, rhodamine, quinacridone, and rubrene.

In some embodiments, A is selected from the group consisting of phenyl, biphenyl, tolyl, naphthyl, naphthylphenyl, and anthracenyl groups.

In some embodiments, the dopant has the formula below:

$$\begin{array}{c}Y\\Y\end{array}C=C-Q'-C=C\begin{array}{c}Y\\Y\end{array}$$
$$\quad\quad H \quad H$$

where:
Y is the same or different at each occurrence and is an aromatic group having 3-60 carbon atoms;
Q' is an aromatic group, a divalent triphenylamine residue group, or a single bond.

In some embodiments, the dopant is an aryl acene. In some embodiments, the dopant is a non-symmetrical aryl acene.

In some embodiments, the dopant is a chrysene derivative having Formula II.

Formula II

[Chemical structure of chrysene derivative with substituents Ar¹, Ar², Ar³, Ar⁴, R⁹, R¹⁰, R¹¹, R¹², R¹³, R¹⁴, R¹⁵, R¹⁶]

wherein:
$Ar^1$ and $Ar^3$ are the same or different and are aryl, and at least one of $Ar^1$ and $Ar^3$ has at least one alkyl substituent, with the proviso that there are no electron-withdrawing group substituents;

$Ar^2$ and $Ar^4$ are the same or different and are aryl;

$R^9$, $R^{10}$, and $R^{12}$ are the same or different and are selected from the group consisting of H and an electron-withdrawing group;

$R^{11}$ is an electron-withdrawing group;

$R^{13}$ through $R^{16}$ are the same or different and are selected from the group consisting of H and alkyl.

In some embodiments, the electron-withdrawing group ("EWG") is selected from the group consisting of fluoro, perfluoroalkyl, cyano, nitro, —SO₂R, where R is alkyl or perfluoroalkyl, and combinations thereof. In some embodiments, the EWG is trifluoromethyl or cyano.

In some embodiments, the photoactive dopant is selected from the group consisting of D10 through D16 shown below.

D10:

[Chemical structure of compound D10]

D11:
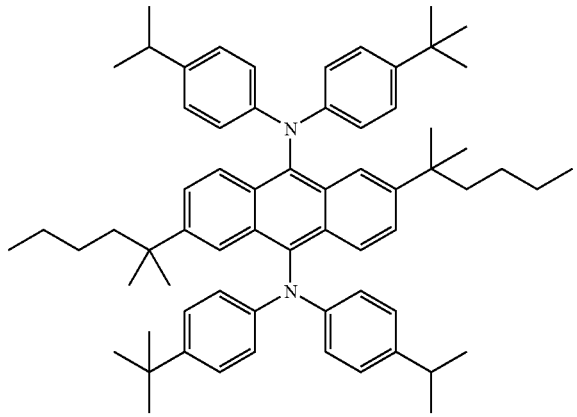

D12:
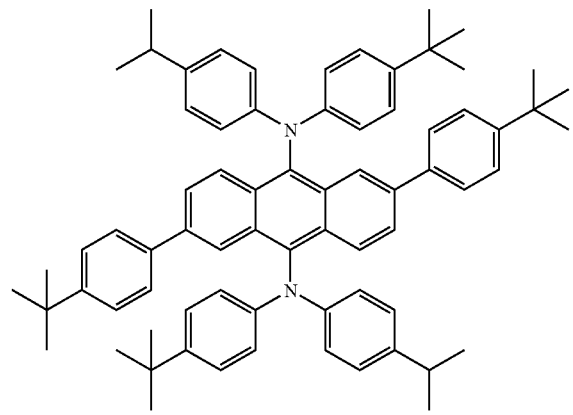

D13:
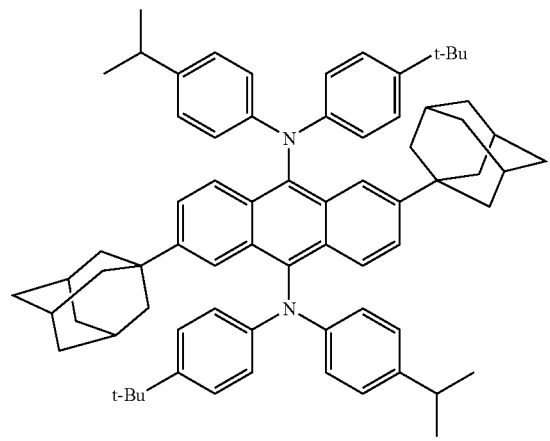

D14:
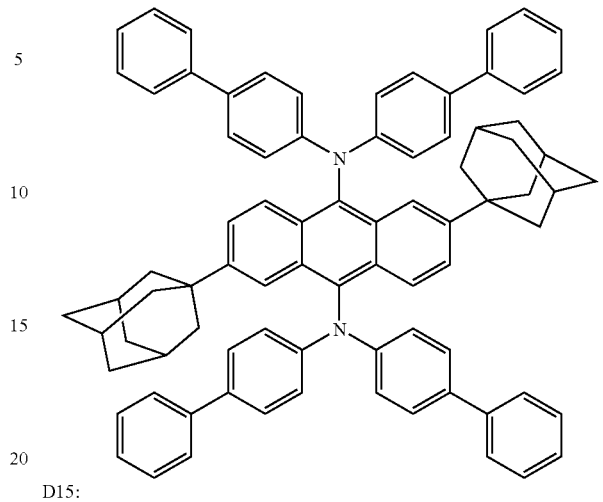

D15:
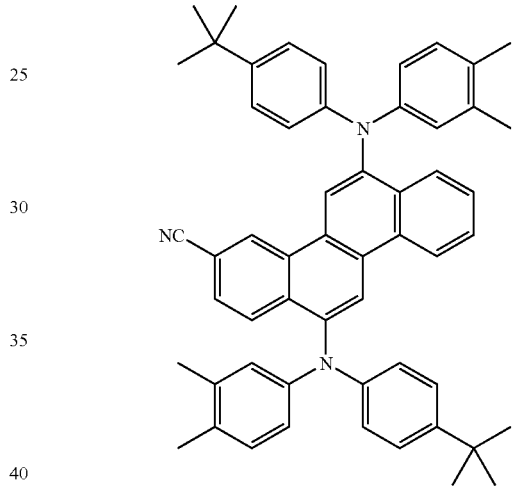

4. Electronic Device

Organic electronic devices that may benefit from having one or more layers comprising the green luminescent materials described herein include, but are not limited to, (1) devices that convert electrical energy into radiation (e.g., a light-emitting diode, light emitting diode display, or diode laser), (2) devices that detect signals through electronics processes (e.g., photodetectors, photoconductive cells, photoresistors, photoswitches, phototransistors, phototubes, IR detectors, biosensors), (3) devices that convert radiation into electrical energy, (e.g., a photovoltaic device or solar cell), and (4) devices that include one or more electronic components that include one or more organic semi-conductor layers (e.g., a transistor or diode).

One illustration of an organic electronic device structure is shown in FIG. 1. The device 100 has a first electrical contact layer, an anode layer 110 and a second electrical contact layer, a cathode layer 160, and a photoactive layer 140 between them. Adjacent to the anode is a buffer layer 120. Adjacent to the buffer layer is a hole transport layer 130, comprising hole transport material. Adjacent to the cathode may be an electron transport layer 150, comprising an electron transport material. As an option, devices may use one or more additional hole injection or hole transport layers (not shown) next to the anode 110 and/or one or more additional electron injection or electron transport layers (not shown) next to the cathode 160.

Layers 120 through 150 are individually and collectively referred to as the active layers.

In one embodiment, the different layers have the following range of thicknesses: anode 110, 500-5000 Å, in one embodiment 1000-2000 Å; buffer layer 120, 50-2000 Å, in one embodiment 200-1000 Å; hole transport layer 130, 50-2000 Å, in one embodiment 200-1000 Å; photoactive layer 140, 10-2000 Å, in one embodiment 100-1000 Å; electron transport layer 150, 50-2000 Å, in one embodiment 100-1000 Å; cathode 160, 200-10000 Å, in one embodiment 300-5000 Å. The location of the electron-hole recombination zone in the device, and thus the emission spectrum of the device, can be affected by the relative thickness of each layer. The desired ratio of layer thicknesses will depend on the exact nature of the materials used.

Depending upon the application of the device 100, the photoactive layer 140 can be a light-emitting layer that is activated by an applied voltage (such as in a light-emitting diode or light-emitting electrochemical cell), or a layer of material that responds to radiant energy and generates a signal with or without an applied bias voltage (such as in a photodetector or a biosensor). Examples of photodetectors include photoconductive cells, photoresistors, photoswitches, phototransistors, and phototubes, and photovoltaic cells, as these terms are described in Markus, John, *Electronics and Nucleonics Dictionary*, 470 and 476 (McGraw-Hill, Inc. 1966). Examples of biosensors include pulse oximeters which sense the change in oxygen bound to hemoglobin by measuring the in/out red light intensity.

The electroactive compositions described herein are useful as the photoactive layer 140. The other layers in the device can be made of any materials that are known to be useful in such layers.

The anode 110, is an electrode that is particularly efficient for injecting positive charge carriers. It can be made of, for example, materials containing a metal, mixed metal, alloy, metal oxide or mixed-metal oxide, or it can be a conducting polymer, or mixtures thereof. Suitable metals include the Group 11 metals, the metals in Groups 4-6, and the Group 8-10 transition metals. If the anode is to be light-transmitting, mixed-metal oxides of Groups 12, 13 and 14 metals, such as indium-tin-oxide, are generally used. The anode 110 can also comprise an organic material such as polyaniline as described in "Flexible light-emitting diodes made from soluble conducting polymer," *Nature* vol. 357, pp 477-479 (11 Jun. 1992). At least one of the anode and cathode is desirably at least partially transparent to allow the generated light to be observed.

The buffer layer 120 comprises buffer material and may have one or more functions in an organic electronic device, including but not limited to, planarization of the underlying layer, charge transport and/or charge injection properties, scavenging of impurities such as oxygen or metal ions, and other aspects to facilitate or to improve the performance of the organic electronic device. Buffer materials may be polymers, oligomers, or small molecules. They may be vapour deposited or deposited from liquids which may be in the form of solutions, dispersions, suspensions, emulsions, colloidal mixtures, or other compositions.

The buffer layer can be formed with polymeric materials, such as polyaniline (PANI) or polyethylenedioxythiophene (PEDOT), which are often doped with protonic acids. The protonic acids can be, for example, poly(styrenesulfonic acid), poly(2-acrylamido-2-methyl-1-propanesulfonic acid), and the like. The buffer layer can comprise charge transfer compounds, and the like, such as copper phthalocyanine and the tetrathiafulvalene-tetracyanoquinodimethane system (TTF-TCNQ). In some embodiments, the buffer layer comprises at least one electrically conductive polymer and at least one fluorinated acid polymer. Such materials have been described in, for example, published U.S. patent applications 2004-0102577, 2004-0127637, and 2005/205860

Layer 130 comprises hole transport material. Examples of hole transport materials for the hole transport layer have been summarized for example, in Kirk-Othmer Encyclopedia of Chemical Technology, Fourth Edition, Vol. 18, p. 837-860, 1996, by Y. Wang. Both hole transporting small molecules and polymers can be used. Commonly used hole transporting molecules include, but are not limited to: 4,4',4"-tris(N,N-diphenyl-amino)-triphenylamine (TDATA); 4,4',4"-tris(N-3-methylphenyl-N-phenyl-amino)-triphenylamine (MTDATA); N,N'-diphenyl-N,N'-bis(3-methylphenyl)-[1,1'-biphenyl]-4,4'-diamine (TPD); 4,4'-bis(carbazol-9-yl)biphenyl (CBP); 1,3-bis(carbazol-9-yl)benzene (mCP); 1,1-bis[(di-4-tolylamino)phenyl]cyclohexane (TAPC); N,N'-bis(4-methylphenyl)-N,N'-bis(4-ethylphenyl)-[1,1'-(3,3'-dimethyl)biphenyl]-4,4'-diamine (ETPD); tetrakis-(3-methylphenyl)-N,N,N',N'-2,5-phenylenediamine (PDA); α-phenyl-4-N,N-diphenylaminostyrene (TPS); p-(diethylamino)benzaldehyde diphenylhydrazone (DEH); triphenylamine (TPA); bis[4-(N,N-diethylamino)-2-methylphenyl](4-methylphenyl)methane (MPMP); 1-phenyl-3-[p-(diethylamino)styryl]-5-[p-(diethylamino)phenyl] pyrazoline (PPR or DEASP); 1,2-trans-bis(9H-carbazol-9-yl)cyclobutane (DCZB); N,N,N',N'-tetrakis(4-methylphenyl)-(1,1'-biphenyl)-4,4'-diamine (TTB); N,N'-bis (naphthalen-1-yl)-N,N'-bis-(phenyl)benzidine (α-NPB); and porphyrinic compounds, such as copper phthalocyanine. Commonly used hole transporting polymers are polyvinylcarbazole, (phenylmethyl)-polysilane, and polyaniline. It is also possible to obtain hole transporting polymers by doping hole transporting molecules such as those mentioned above into polymers such as polystyrene and polycarbonate. In some cases, triarylamine polymers are used, especially triarylamine-fluorene copolymers. In some cases, the polymers and copolymers are crosslinkable. Examples of crosslinkable hole transport polymers can be found in, for example, published US patent application 2005-0184287 and published PCT application WO 2005/052027. In some embodiments, the hole transport layer is doped with a p-dopant, such as tetrafluorotetracyanoquinodimethane and perylene-3,4,9,10-tetracarboxylic -3,4,9,10-dianhydride.

Layer 140 comprises the new electroactive composition described herein. In some embodiments, layer 140 consists essentially of the new electroactive composition.

Layer 150 can function both to facilitate electron transport, and also serve as a buffer layer or confinement layer to prevent quenching of the exciton at layer interfaces. Preferably, this layer promotes electron mobility and reduces exciton quenching. Examples of electron transport materials which can be used in layer 150 include metal chelated oxinoid compounds, including metal quinolate derivatives such as tris(8-hydroxyquinolato)aluminum (AlQ), bis(2-methyl-8-quinolinolato)(p-phenylphenolato)aluminum (BAlq), tetrakis-(8-hydroxyquinolato)hafnium(HfQ) and tetrakis-(8-hydroxyquinolato)zirconium (ZrQ); and azole compounds such as 2-(4-biphenylyl)-5-(4-t-butylphenyl)-1,3,4-oxadiazole (PBD), 3-(4-biphenylyl)-4-phenyl-5-(4-t-butylphenyl)-1,2,4-triazole (TAZ), and 1,3,5-tri(phenyl-2-benzimidazole) benzene (TPBI); quinoxaline derivatives such as 2,3-bis(4-fluorophenyl)quinoxaline; phenanthrolines such as 4,7-diphenyl-1,10-phenanthroline (DPA) and 2,9-dimethyl-4,7-diphenyl-1,10-phenanthroline (DDPA); and mixtures thereof. In some embodiments, the electron transport layer further comprises an n-dopant. Examples of n-dopants include, but are not limited to Cs or other alkali metals.

The cathode 160, is an electrode that is particularly efficient for injecting electrons or negative charge carriers. The cathode can be any metal or nonmetal having a lower work function than the anode. Materials for the cathode can be selected from alkali metals of Group 1 (e.g., Li, Cs), the Group 2 (alkaline earth) metals, the Group 12 metals, including the rare earth elements and lanthanides, and the actinides. Materials such as aluminum, indium, calcium, barium, samarium and magnesium, as well as combinations, can be used. Li-containing organometallic compounds, LiF, $Li_2O$, Cs-containing organometallic compounds, CsF, $Cs_2O$, and $Cs_2CO_3$ can also be deposited between the organic layer and the cathode layer to lower the operating voltage.

It is known to have other layers in organic electronic devices. For example, there can be a layer (not shown) between the anode 110 and buffer layer 120 to control the amount of positive charge injected and/or to provide bandgap matching of the layers, or to function as a protective layer. Layers that are known in the art can be used, such as copper phthalocyanine, silicon oxy-nitride, fluorocarbons, silanes, or an ultra-thin layer of a metal, such as Pt. Alternatively, some or all of anode layer 110, active layers 120, 130, 140, and 150, or cathode layer 160, can be surface-treated to increase charge carrier transport efficiency. The choice of materials for each of the component layers is preferably determined by balancing the positive and negative charges in the emitter layer to provide a device with high electroluminescence efficiency.

It is understood that each functional layer can be made up of more than one layer.

The device layers can be formed by any deposition technique, or combinations of techniques, including vapor deposition, liquid deposition, and thermal transfer. Substrates such as glass, plastics, and metals can be used. Conventional vapor deposition techniques can be used, such as thermal evaporation, chemical vapor deposition, and the like. The organic layers can be applied from solutions or dispersions in suitable solvents, using conventional coating or printing techniques, including but not limited to spin-coating, dip-coating, roll-to-roll techniques, ink-jet printing, continuous nozzle printing, screen-printing, gravure printing and the like.

In some embodiments, the device is fabricated by liquid deposition of the buffer layer, the hole transport layer, and the photoactive layer, and by vapor deposition of the anode, the electron transport layer, an electron injection layer and the cathode.

It is understood that the efficiency of devices made with the electroactive compositions described herein, can be further improved by optimizing the other layers in the device. For example, more efficient cathodes such as Ca, Ba or LiF can be used. Shaped substrates and novel hole transport materials that result in a reduction in operating voltage or increase quantum efficiency are also applicable. Additional layers can also be added to tailor the energy levels of the various layers and facilitate electroluminescence.

EXAMPLES

The concepts described herein will be further described in the following examples, which do not limit the scope of the invention described in the claims.

Example 1

This example illustrates the preparation of host material C9

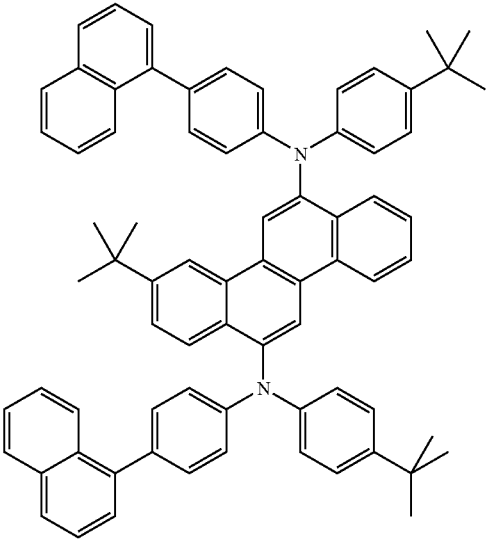 [SMILES: CC(C)(C)c1ccc(N(c2ccc(-c3cccc4ccccc34)cc2)c2cc3c4cc(C(C)(C)C)ccc4c(N(c4ccc(-c5cccc6ccccc56)cc4)c4ccc(C(C)(C)C)cc4)cc3c3ccccc23)cc1]

a. Preparation of 1-(4-tert-butylstyryl)naphthalenes.

An oven-dried 500 ml three-neck round bottom flask was equipped with a magnetic stir bar, addition funnel and nitrogen inlet connector. The flask was charged with (1-napthylmethyl)triphenylphosphonium chloride (12.07 g, 27.5 mmol) and 200 ml of anhydrous THF. Sodium hydride (1.1 g, 25 mmol) was added in one portion. The mixture became bright orange and was left to stir overnight at room temperature. A solution of 4-tert-butyl-benzaldehyde (7.1 g, 25 mmol) in anhydrous THF (30 ml) was added to the addition funnel with a cannula. The aldehyde solution was added to the reaction mixture dropwise over 45 minutes. Reaction was left to stir at room temperature for 24 hours (orange color went away). Silica gel was added to the reaction mixture and volatiles were removed under reduced pressure. The crude product was purified by column chromatography on silica gel using 5-10% dichloromethane in hexanes. The product was isolated as a mixture of cis- and trans-isomers (6.3 g, 89%) and used without separation. $^1$H NMR ($CD_2Cl_2$): δ 1.27 (s, 9H), 7.08 (d, 1H, J=16 Hz), 7.33-7.49 (m, 7H), 7.68 (d, 1H, J=7.3 Hz), 7.71 (d, 1H, J=8.4 Hz), 7.76-7.81 (m, 2H), 8.16 (d, 1H, J=8.3 Hz).

b. Preparation of 3-tert-butylchrysene.

1-(4-tert-Butylstyryl)naphthalenes (4.0 g, 14.0 mmol) were dissolved in dry toluene (1 l) in a one-liter photochemical vessel, equipped with nitrogen inlet and a stirbar. A bottle of dry propylene oxide was cooled in ice-water before 100 ml of the epoxide was withdrawn with a syringe and added to the reaction mixture. Iodine (3.61 g, 14.2 mmol) was added last. Condenser was attached on top of the photochemical vessel and halogen lamp (Hanovia, 450 W) was turned on. Reaction was stopped by turning off the lamp when no more iodine was left in the reaction mixture, as evidenced by the disappearance of its color. The reaction was complete in 3.5 hours. Toluene and excess propylene oxide were removed under reduced pressure to yield a dark yellow solid. Crude product was dissolved in a small amount of 25% dichloromethane in hexane, passed through a 4" plug of neutral alumina, and washed with 25% dichloromethane in hexane (about one liter). Volatiles were removed to give 3.6 g (91%) of 3-tert-butylchrysene as a yellow solid. $^1$H NMR ($CD_2Cl_2$): δ 1.41 (s, 9H), 7.51 (app t, 1H), 7.58 (app t, 1H), 7.63 (dd(1H, J=1.8, 8.4 Hz), 7.80-7.92 (m, 4H), 8.54 (d, 1H, J=9.1 Hz), 8.63-8.68 (m, 3H).

c. Preparation of 6,12-dibromo-3-tert-butylchrysene 3-tert-Butylchrysene (4.0 g, 14.1 mmol) and trimethylphosphate (110 ml) were mixed in a 500 ml round-bottom flask. After bromine (4.95 g, 31 mmol) was added, a reflux condenser was attached to the flask and reaction mixture was stirred for one hour in an oil bath at 105° C. A white precipitate formed almost immediately. Reaction mixture was worked up by pouring it onto a small amount of ice water (100 ml). The mixture was vacuum-filtered and washed well with water. The resulting tan solid was dried under vacuum. The crude product was boiled in methanol (100 ml), cooled to room temperature and filtered again to yield 3.74 g (60%) of a white solid. $^1$H NMR (CD$_2$Cl$_2$): δ 1.46 (s, 9H), 7.70 (m, 2H), 7.79 (dd, 1H, J=1.9, 8.8 Hz), 8.28 (d, 1H, J=8.7 Hz), 8.36 (dd, 1H, J=1.5, 8.0), 8.60 (d, 1H, J=1.8 Hz), 8.64 (dd, 1H, J=1.5, 8.0 Hz), 8.89 (s, 1H), 8.97 (s, 1H).

d. Host material C9.

In a drybox, 3-tert-butyl-6,12-dibromochrysene (0.5 g, 1.13 mmol) and N-(4-(1-naphthyl)phenyl)-4-tert-butylaniline (0.83 g, 2.37 mmol) were combined in a thick-walled glass tube and dissolved in 20 ml of dry toluene. Tris(tert-butyl)phosphine (0.009 g, 0.045 mmol) and tris(dibenzylideneacetone) dipalladium(0) (0.021 g, 0.023 mmol) were dissolved in 5 ml of dry toluene and stirred for 10 minutes. The catalyst solution was added to the reaction mixture, stirred for 5 minutes and followed by sodium tert-butoxide (0.217 g, 2.26 mmol) and 15 ml of dry toluene. After another 10 minutes, the reaction flask was brought out of the drybox, attached to a nitrogen line and stirred at 80° C. overnight. Next day, reaction mixture was cooled to room temperature and filtered through a 4 inch plug of silica gel and one inch of Celite®, washing with one liter of chloroform and 300 ml of dichloromethane. Removal of volatiles under reduced pressure gave a yellow solid. Crude product was purified by column chromatography with 5-12% CH$_2$Cl$_2$ in hexane. Yield 440 mg (33.6%). $^1$H NMR (dmf-d$_7$): δ 1.29 (s, 9H), 1.30 (s, 9H), 1.43 (s, 9H), 7.23 (m, 4H), 7.31 (m, 4H), 7.41-7.46 (m, 10H), 7.46-7.59 (m, 6H),7.66 (app t, 1H, J=7.6 Hz), 7.75 (app t, $^1$H, J=7.6 Hz), 7.81 (dd, 1H, J=1.8, 8.5 Hz), 7.93 (dd, 2H, J=3.3, 8.4 Hz), 8.25 (d, 1H, J=8.8 Hz), 8.27 (dd, 1H, J=1.1, 8.9 Hz), 8.83 (d, 1H, J=1.7 Hz), 8.98 (s, 1H), 8.99 (d, 1H, J=8.3 Hz), 9.03 (s, 1H).

Example 2

Host material C18 was prepared using an analogous procedure.

Example 3

Red light-emitting dopant material D6 was prepared using a procedure similar to that described in U.S. Pat. No. 6,670,645.

Examples 4 and 5

These examples demonstrate the fabrication and performance of devices having red emission. The following materials were used:

Indium Tin Oxide (ITO): 100 nm buffer layer=Buffer 1 (25 nm), which is an aqueous dispersion of an electrically conductive polymer and a polymeric fluorinated sulfonic acid. Such materials have been described in, for example, published U.S. patent applications US 2004/0102577, US 2004/0127637, and US 2005/0205860.

hole transport layer=HT-1 (20 nm), which is an arylamine-containing copolymer. Such materials have been described in, for example, published U.S. patent application US 2008/0071049.

photoactive layer=92:8 host:dopant (48 nm)

electron transport layer=a metal quinolate derivative (20 nm)

cathode=CsF/Al (0.5/100 nm)

OLED devices were fabricated by a combination of solution processing and thermal evaporation techniques. Patterned indium tin oxide (ITO) coated glass substrates from Thin Film Devices, Inc were used. These ITO substrates are based on Corning 1737 glass coated with ITO having a sheet resistance of 30 ohms/square and 80% light transmission. The patterned ITO substrates were cleaned ultrasonically in aqueous detergent solution and rinsed with distilled water. The patterned ITO was subsequently cleaned ultrasonically in acetone, rinsed with isopropanol, and dried in a stream of nitrogen.

Immediately before device fabrication the cleaned, patterned ITO substrates were treated with UV ozone for 10 minutes. Immediately after cooling, an aqueous dispersion of Buffer 1 was spin-coated over the ITO surface and heated to remove solvent. After cooling, the substrates were then spin-coated with a solution of a hole transport material, and then heated to remove solvent. After cooling the substrates were spin-coated with the emissive layer solution, and heated to remove solvent. The substrates were masked and placed in a vacuum chamber. A ZrQ layer was deposited by thermal evaporation, followed by a layer of LiF. Masks were then changed in vacuo and a layer of Al was deposited by thermal evaporation. The chamber was vented, and the devices were encapsulated using a glass lid, dessicant, and UV curable epoxy. The OLED samples were characterized by measuring their (1) current-voltage (I-V) curves, (2) electroluminescence radiance versus voltage, and (3) electroluminescence spectra versus voltage. All three measurements were performed at the same time and controlled by a computer. The current efficiency of the device at a certain voltage is determined by dividing the electroluminescence radiance of the LED by the current density needed to run the device. The unit is a cd/A. The results are given in Table 1.

TABLE 1

| Example | Host | Dopant | CE [cd/A] | EQE [%] | Lum. ½ Life [h] |
|---|---|---|---|---|---|
| 4 | C9 | D6 | 7 | 8 | 7000 |
| 5 | C18 | D6 | 9 | 11 | 10000 |

* All data @ 1000 nits, CE = current efficiency, EQE = quantum efficiency, Lum. ½ Life = time to half of initial luminance in hours @ 25° C.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges include each and every value within that range.

What is claimed is:

1. An electroactive composition comprising (a) a host material and (b) an electroactive dopant capable of electroluminescence having an emission maximum between 500 and 700 nm;
    wherein the dopant is a cyclometalated complex of iridium or platinum, and wherein the host material is selected from the group consisting of C10 through C15

C10:

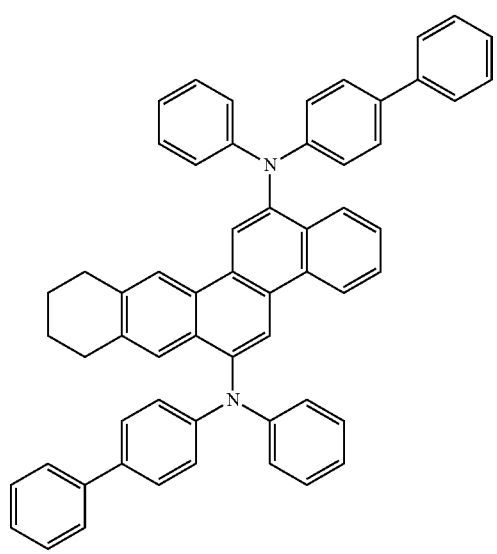

C11:

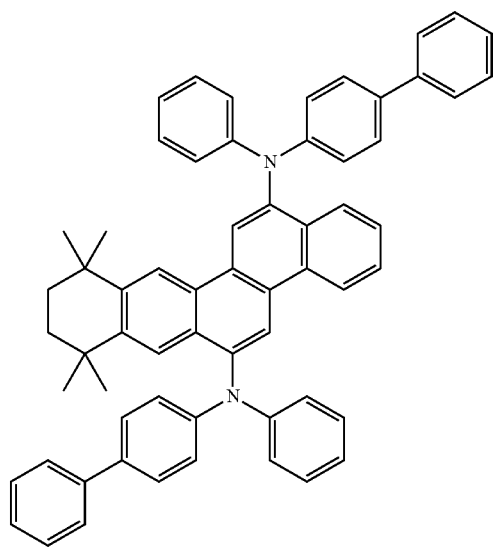

C12:

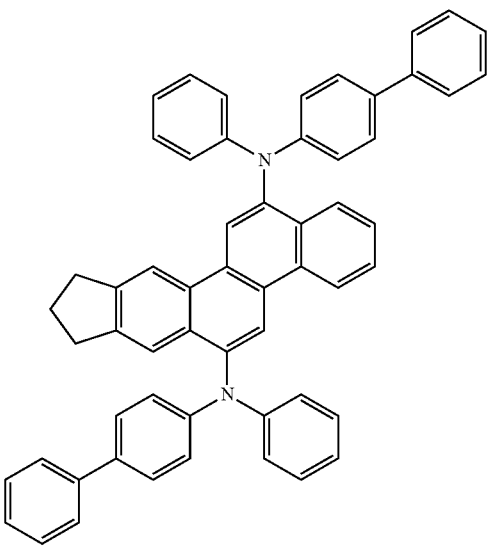

C13:

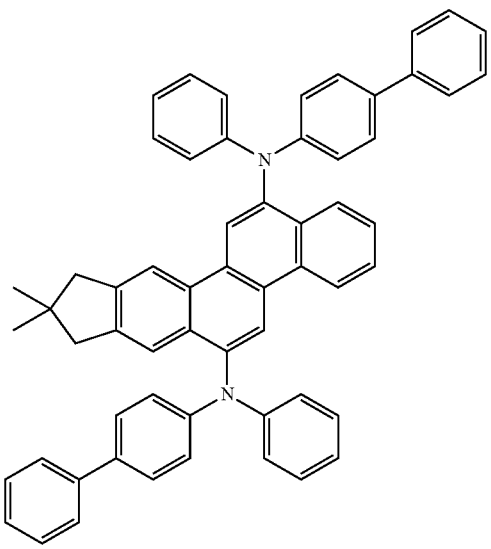

C14:
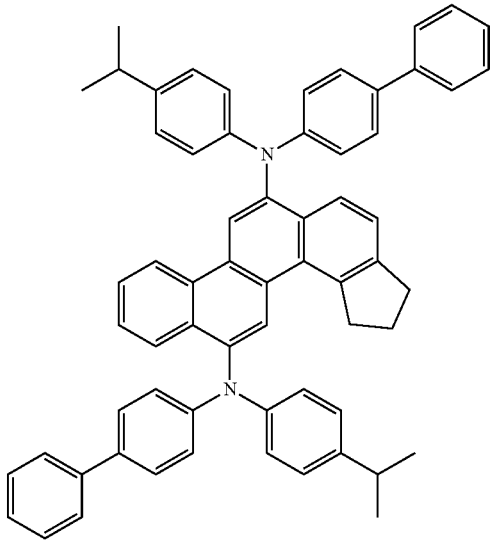
C15:
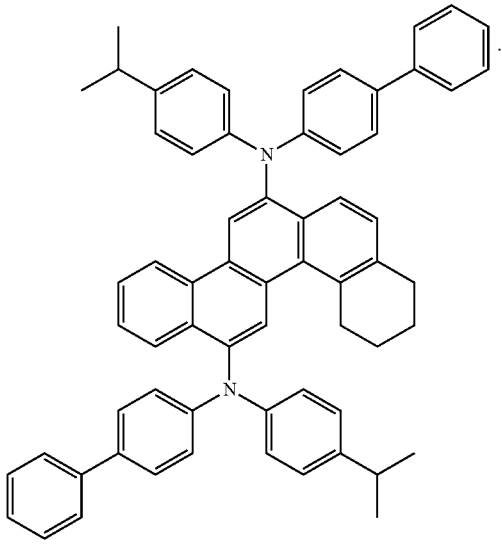
wherein the dopant is a cyclometalated complex of iridium or platinum, and wherein the host material is selected from the group consisting of C18 through C21
C18:
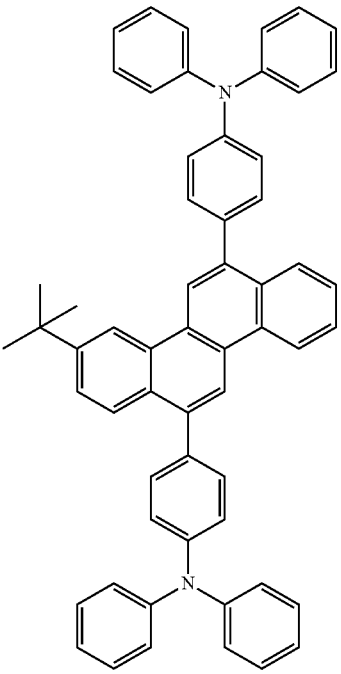
C19:
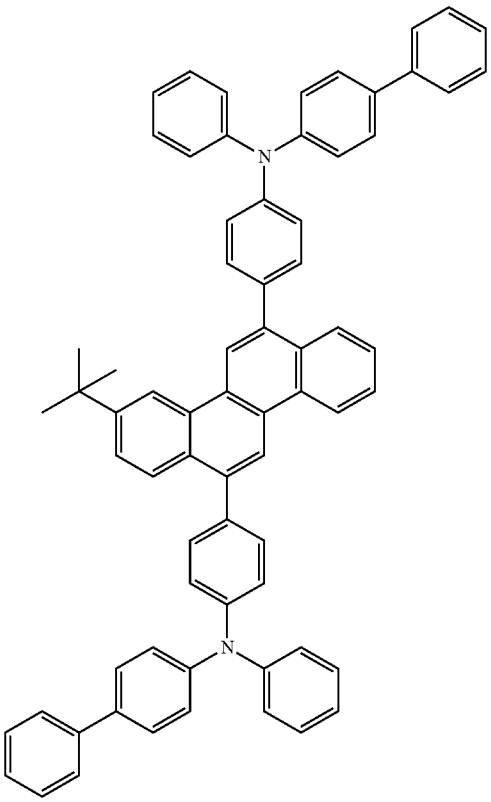
2. An electroactive composition comprising (a) a host material and (b) an electroactive dopant capable of electroluminescence having an emission maximum between 500 and 700 nm;

-continued

C20:

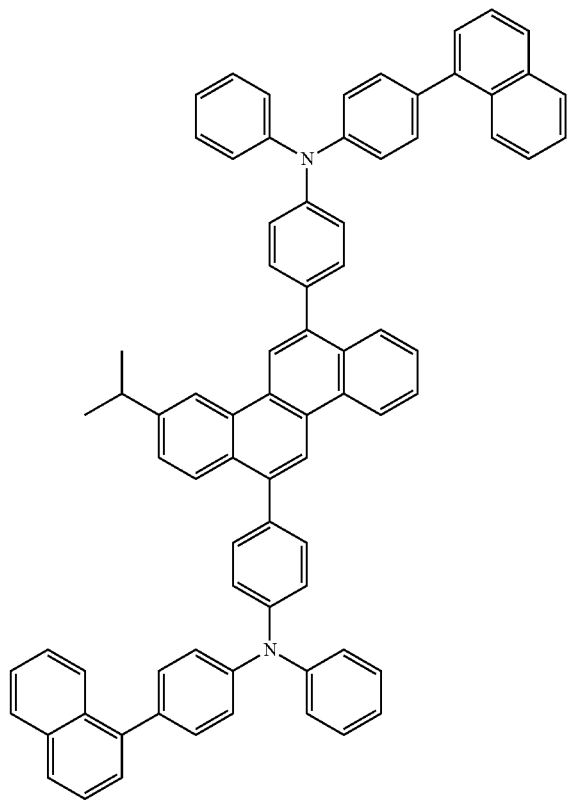

C21:

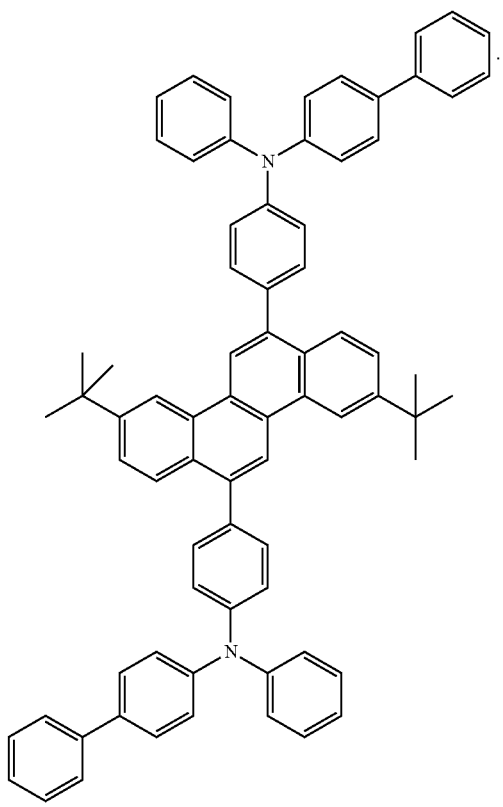

3. An organic electronic device comprising two electrical contact layers with an organic electroactive layer therebetween, wherein the electroactive layer comprises the composition of claim 1.

4. An organic electronic device comprising two electrical contact layers with an organic electroactive layer therebetween, wherein the electroactive layer comprises the composition of claim 2.

5. The device of claim 4, wherein the electroactive layer is a photoactive layer.

6. The device of claim 4, further comprising an electron transport layer comprising electron transport material selected from the group consisting of metal chelated oxinoid compounds, azole compounds, quinoxaline derivatives;

phenanthrolines, and mixtures thereof, and which may further comprise an n-dopant.

7. The device of claim 4, wherein a first of the two electrical contact layers is an anode and a second of the two electrical contact layers is a cathode, and further comprising a layer deposited between an organic layer and the cathode, said deposited layer comprising a material selected from the group consisting of Li-containing organometallic compounds, LiF, $Li_2O$, Cs-containing organometallic compounds, CsF, $Cs_2O$, and $Cs_2CO_3$.

8. The device of claim 3, wherein the electroactive layer is a photoactive layer.

9. The device of claim 3, further comprising an electron transport layer comprising electron transport material selected from the group consisting of metal chelated oxinoid compounds, azole compounds, quinoxaline derivatives;

phenanthrolines, and mixtures thereof, and which may further comprise an n-dopant.

10. The device of claim 3, wherein a first of the two electrical contact layers is an anode and a second of the two electrical contact layers is a cathode, and further comprising a layer deposited between an organic layer and the cathode, said deposited layer comprising a material selected from the group consisting of Li-containing organometallic compounds, LiF, $Li_2O$, Cs-containing organometallic compounds, CsF, $Cs_2O$, and $Cs_2CO_3$.

* * * * *